PULSE GENERATOR WITH STEP FREQUENCY CONTROL
Filed Nov. 14, 1968
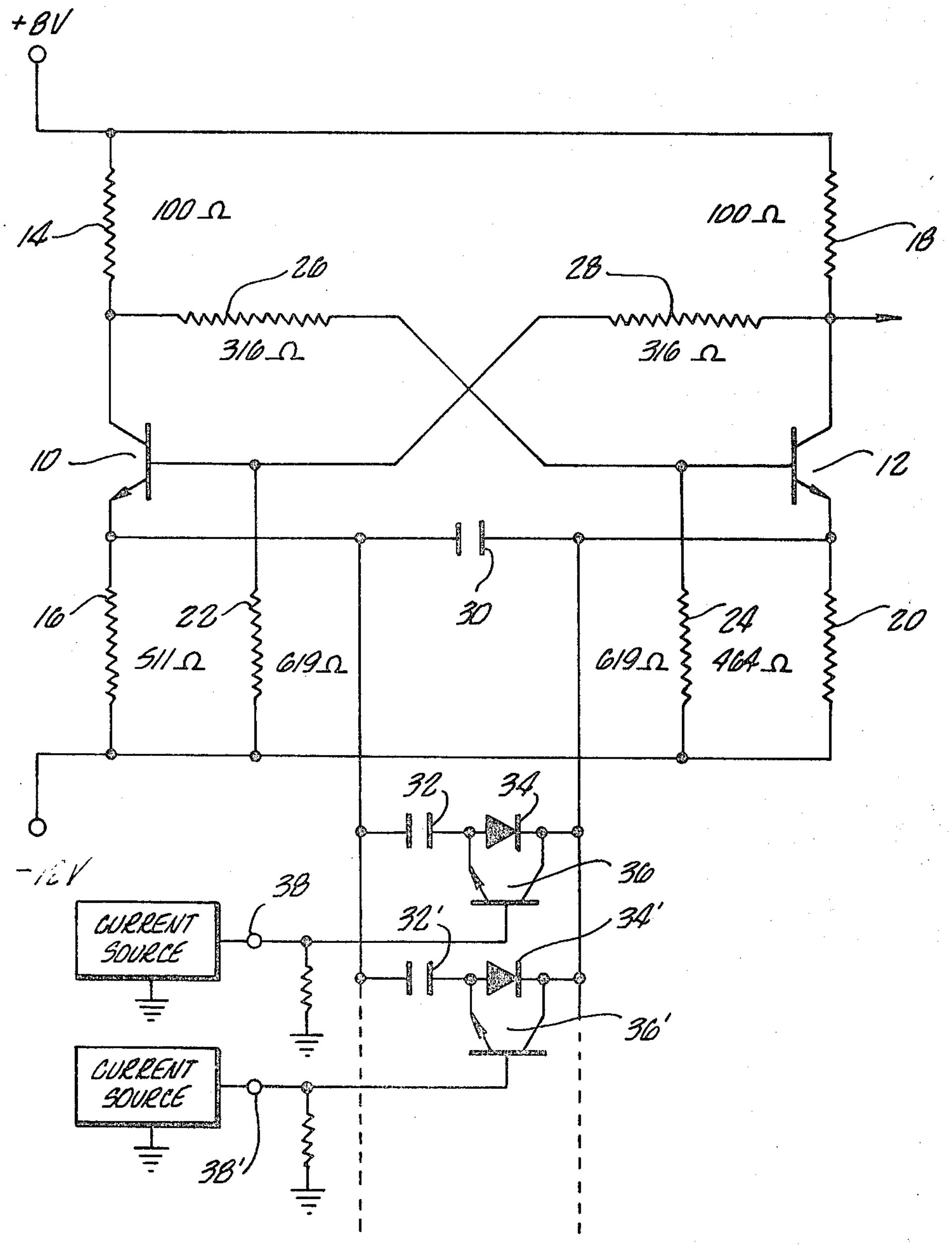
INVENTOR.
PETER L. KRAUSE
BY
Christie, Parker & Hale
ATTORNEYS

United States Patent Office 3,543,185
Patented Nov. 24, 1970

3,543,185

PULSE GENERATOR WITH STEP FREQUENCY CONTROL

Peter L. Krause, Thousand Oaks, Calif., assignor to Burroughs Corporation, Detroit, Mich., a corporation of Michigan Filed Nov. 14, 1968, Ser. No. 775,684
Int. Cl. H03k 3/282
U.S. Cl. 331—113 3 Claims

ABSTRACT OF THE DISCLOSURE

There is described a multivibrator type oscillator in which the capacitance controlling the frequency of the oscillator can be changed in steps by a solid state switching arrangement.

BACKGROUND OF THE INVENTION

This invention relates to multivibrator type oscillators and, more particularly, to an oscillator including electronic switching means for varying the capacitance in the circuit to change the frequency of the oscillator.

Multivibrator circuits which operate as free running oscillators are well known. Such circuits, because they generate square pulses at controlled repetition frequencies and controlled pulse durations, are commonly used as clock pulse sources in computers and the like. One preferred type of circuit utilizes a pair of transistors with a single capacitor connected between the emitters for controlling the frequency of oscillation. The present invention is concerned with an improved circuit for switching in electronically different values of capacitance in such a circuit without stopping the oscillation or affecting the peak voltage of the output pulses. Known switching arrangements have required two switching currents for controlling each switch or have required special and expensive transistors which conduct equally well in both directions.

SUMMARY OF THE INVENTION

In brief, the oscillator of the present invention provides for a series of parallel circuits connected between the emitters of a pair of transistors forming the oscillator circuit, each parallel circuit including a capacitor and diode in series, the diode being connected to pass current in a first direction through the capacitor. The diode in each circuit is shunted by the emitter-collector terminals of a transistor connected to pass current in the opposite direction through the capacitor. Base current is selectively provided to the transistor in one of the parallel circuits to switch in a particular value of capacitance to the oscillator.

BRIEF DESCRIPTION OF THE DRAWING

For a more complete understanding of the invention, reference should be made to the accompanying drawing wherein:

The single figure is a schematic circuit diagram of the preferred embodiment of the invention.

DESCRIPTION OF THE PREFERRED EMBODIMENT

The multivibrator incorporating the features of the present invention preferably is of a type including a pair of transistors 10 and 12. The collector of the transistor 10 is connected to the positive end of a potential source (not shown) through a collector load resistor 14 while the emitter is connected to the negative end of the potential source through an emitter resistor 16. Similarly the collector of the transistor 12 is connected through a resistor 18 to the positive end of the potential source while the emitter is connected through a resistor 20 to the negative end of the potential source. The base electrode of the transistor 10 is connected through a resistor 22 to the negative end of the potential source and the base of the transistor 12 is connected through a resistor 24 to the negative end of the potential source. Feedback resistors 26 and 28, respectively, cross-couple the collector of the transistor 10 to the base of the transistor 12 and the collector of the transistor 12 to the base of the transistor 10.

Considering the operation of the circuit as thus far described, with transistor 12 conducting and transistor 10 turned off, emitter current flows through the resistor 20 and also through the capacitor 30 and resistor 16, thus charging the capacitor 30. As the voltage builds up across the capacitor 30, the emitter of the transistor 10 becomes more negative, decreasing the base-to-emitter bias of the transistor 10 to the point where the transistor 10 begins to conduct. This causes the collector voltage to drop, thereby turning off the transistor 12. This has a regenerating effect, since as the transistor 12 turns off, the collector voltage rises, turning on the transistor 10 more strongly. The emitter current to the transistor 10 now charges the capacitor 30 in the opposite direction, causing the transistor 12 again to turn on and the transistor 10 to turn off, completing the next half cycle of the oscillation. By proper selection of the resistance values, the transistors never enter saturation when they are on.

To change the frequency of oscillation, it is desirable to change only the value of the capacitor 30. This is accomplished, according to the present invention, by providing a number of parallel circuits shunting the capacitor 30, two of which are shown by way of example. Each parallel circuit includes a capacitor 32 connected in series with a diode 34. The diode is shunted by the emitter-collector circuit of a transistor 36, arranged to conduct current in the opposite direction to the direction of current passed by the diode 34. The base of the transistor 36 is connected to a reference bias potential such that the transistor normally is maintained in a nonconductive state. By providing a switching current to the base of a selected one of the transistors 36 through an input terminal 38, the particular transistor can be turned on, providing in combination with the diode 34, bidirectional current flow relative to the capacitor 32. Thus, additional amounts of capacitance can be in effect switched into parallel with the capacitor 30 to change the value of the capacitance in the oscillator circuit. Unless the transistor 36 is turned on, the capacitor 32 charges up in only one direction through the diode 34. During the next half cycle, the diode blocks the charging of the capacitor in the other direction so that the capacitor has no effect in the circuit. However, when the associated transistor 36 is turned on, the capacitor 32 can be charged by the current flowing through the transistor and around the diode 34. Thus, the capacitor 32 is charged alternately in one direction and then the other during the successive half cycles in the same manner as the capacitor 30. Because the peak-to-peak voltage swing across the capacitor 30 is constant, when a particular transistor 36 is turned off, series capacitor 32 is charged during one half cycle and remains at the peak voltage during successive cycles, thereby having no effect on the operation of the circuit. By this arrangement, the step change in frequency can be made extremely fast with no other adverse change in the operating characteristics of the circuit.

What is claimed is:

1. A step frequency oscillator comprising first and second transistor stages, each stage including a first resistor connecting the collector of the transistor stage to one end of a potential source, a second resistor connecting the emitter to the other end of the potential source, and a third resistor connecting the base to said other end of the potential source, means including a resistor connecting the collector of each transistor stage to the base of the other transistor stage, and a frequency control circuit connected between the emitter of the two stages, the control circuit including a capacitor and diode in series, a switching transistor having its emitter connected to one end of the diode and its collector connected to the other end of the diode, and means for selectively directing current to the base of the switching transistor to turn on the transistor, the switching transistor and diode being connected in opposite polarity to conduct current in opposite directions relative to the capacitor.

2. Apparatus as defined in claim 1 comprising a plurality of said frequency control circuits connected in parallel.

3. In a multivibrator type pulse generator in which a pair of transistors are alternately turned on and off by the charging and recharging of a capacitor, apparatus for changing the frequency of the pulse generator comprising a plurality of parallel circuits, each circuit including a capacitor and a diode in series, and a transistor switch having the emitter-collector terminals across the diode, the transistor being connected to shunt current around the diode when the diode is reverse biased and the transistor is conductive, and means for connecting a current source to the base of any selected one of said transistors to bias the selected transistor into a conductive state.

No references cited.

JOHN KOMINSKI, Primary Examiner

U.S. Cl. X.R.

331—111, 179; 332—14; 334—15